United States Patent [19]

Hartmann

[11] Patent Number: 4,491,758
[45] Date of Patent: Jan. 1, 1985

[54] SURFACE WAVE DEVICE WITH OVERSAMPLED WITHDRAWAL WEIGHTING

[75] Inventor: Clinton S. Hartmann, Carrollton, Tex.

[73] Assignee: R F Monolithics, Inc., Dallas, Tex.

[21] Appl. No.: 491,081

[22] Filed: May 3, 1983

[51] Int. Cl.³ .............................................. H03H 9/25
[52] U.S. Cl. ............................ 310/313 C; 310/313 B; 333/154; 333/196
[58] Field of Search ........... 310/313 R, 313 B, 313 C; 333/150, 151, 153, 154, 194, 195, 196

[56] References Cited

U.S. PATENT DOCUMENTS

| | | | |
|---|---|---|---|
| 3,686,518 | 8/1972 | Hartmann et al. | 310/313 B |
| 3,727,155 | 4/1973 | De Vries | 333/194 |
| 3,987,376 | 10/1976 | Kerbel | 310/313 B |
| 4,146,808 | 3/1979 | Laker et al. | 310/313 B |

Primary Examiner—J. D. Miller
Assistant Examiner—D. L. Rebsch
Attorney, Agent, or Firm—Kanz, Scherback & Timmons

[57] ABSTRACT

A surface wave device (10) having substrate with at least a surface layer of piezoelectric material (12) and at least one pair of opposing electrically conducting pads (14 and 16) is disclosed. A first group of at least three electrodes (18, 20 and 22) in a distance (24) of one half wavelength of a preselected operating frequency is disposed on the piezoelectric surface between the opposing pads. At least one of the electrodes is electrically connected to one of the opposing pads and the remaining electrodes are electrically connected to the other opposing pad. The sequence of the three electrodes is unevenly distributed with respect to which of the pads the electrodes are connected to. At least two additional groups of at least three electrodes similar to the first group have sequences of electrodes within each group that is distinct from the other groups. In all, a plurality of electrodes is disposed on the piezoelectric surface and the number of such electrodes in distances of one half wavelength of the preselected frequency varies. There are at least three such numbers which are distinct from each other.

14 Claims, 6 Drawing Figures

| ELECTRODES PER WAVELENGTH | # OF STATES | STRENGTH | CONFIGURATION |
|---|---|---|---|
| 2 | 2 | 0 | |
|   |   | 1 | |
| 3 | 2 | 0 | |
|   |   | 1 | |
| 4 | 3 | 0 | |
|   |   | 1 | |
|   |   | 1.414 = COS(45) + COS(−45) | |
| 5 | 4 | 0 | |
|   |   | 1 | |
|   |   | 1.618 = COS(36) + COS(−36) | |
|   |   | 0.618 = COS(72) + COS(−72) | |

FIG. 3A

| ELECTRODES PER WAVELENGTH | # OF STATES | STRENGTH | CONFIGURATION |
|---|---|---|---|
| 6 | 4 | 0 |  |
| | | 1 |  ... |
| | | COS(-30)+COS(30) = 1.732 |  |
| | | 1 + COS(-60) + COS(60) = 2.0 |  |
| 8 | 7 | 0 |  |
| | | 1 |  |
| | | COS(22.5)+COS(-22.5) = 1.848 |  |
| | | 1 + COS(45°)+COS(-45°) = 2.414 |  |
| | | COS(45°)+COS(-45°) = 1.414 |  |
| | | COS(67.5)+COS(-67.5) = 0.765 |  |
| | | 2.613 |  |

SURFACE WAVE DEVICE WITH OVERSAMPLED WITHDRAWAL WEIGHTING

DESCRIPTION

1. Technical Field

The present invention relates generally to acoustic wave devices known as SAW devices an in one of its aspects to a method and apparatus for shaping the time response of waves generated on a SAW device.

2. Background Art

U.S. Pat. No. 3,360,749 shows a basic SAW device using interditigtal electrode transducers. Such a SAW device has a substrate with at least a surface layer of piezoelectric material and acoustic wave transducers disposed on the piezoelectric surface. The transducers convert between an electrical signal and acoustic surface waves propagating on the piezoelectric surface. In the very popular structure shown, there is a one-to-one correspondence between the impulse response of the transducer and its electrode geometry as pointed out in the invited paper of the April, 1973 *IEEE Transactions On Microwave Theory and Techniques* entitled "Impulse Model Design Of Acoustic Surface-Wave Filters" by the inventor of the present invention along with D. T. Bell, Jr. and R. C. Rosenfeld, Volume MTT-21, No. 4, pages 162–175. The electrodes are spaced to specify each half cycle in the impulse response. The class of devices realized by this type of transducer is generally referred to as transversal filters, in that the surface acoustic wave makes a single transverse from the input transducer structure to the output transducer structure.

Internal reflection effects in transversal filters have been eliminated by increasing the number of electrodes per acoustic wavelength, resulting in the split-electrode geometry which typically has four electrodes per wavelength as pointed out in "Reflection Of a Surface Wave From The Three Types Of ID Transducers," 1972 *Ultrasonic Symposium Proceedings*, IEEE, No. 72 CHO 7088SU by de Vries et al and U.S. Pat. No. 3,727,155 to de Vries. In split electrode transducers, the reflections from one electrode of the transducer are canceled by reflections from an adjacent transducer electrode. In a three electrode per wavelength geometry shown in U.S. Pat. No. 3,686,518 to the present inventor and William S. Jones, similar cancellation of reflective waves occurs, but only when reflections from three electrodes are considered.

Hungsinger and Kansy have previously discussed the use of oversampling techniques in SAW tranducers in the "Proceedings of the 29th Annual Symposium on Frequency Control" as a method for implementing nonsymmetrical passbands with uniform tap spacing. In that work, apodization or overlap weighting was a critical element which allowed one to implement the widely varying tap amplitudes which resulted.

A design technique known as withdrawal weighting is used to approximate a desired transducer impulse response. A uniform overlap transducer is constructed with finger placement corresponding to the relative time delay between the various half-cycles in the impulse response. Fingers are then withdrawn in order to equalize the areas under the desired impulse envelope and the finger withdrawn transducers impulse response envelope. As a practical matter, the fingers are not actually withdrawn but are simply connected to the ground rather than to the hot side transducer pad. A significant operational limitation has restricted the use of withdrawal weighted transducers. Withdrawal attempts to approximate the desired time response function by using periodically sampled weights of zero for ground electrodes or plus one for hot electrodes. The limitation of the tap values to zero and one is quite severe and can only provide a good approximation to the desired function over a limited band. The further away from center frequency, the worse the approximation and the worse the stop-band rejection. It is especially difficult to obtain an adequate approximation to a time response that has several small side lobes.

DISCLOSURE OF INVENTION

In accordance with the present invention, a surface wave device includes a substrate having at least a surface layer of piezoelectric material, at least one pair of opposing electrically conducting pads disposed on the piezoelectric surface and a first group of at least four electrodes in a distance of one wavelength of a preselected operating frequency in a direction longitudinal to the opposing pads. The electrodes are disposed transversely to the opposing pads on the piezoelectric surface between the pads, and at least two of the electrodes are electrically connected to one of the opposing pads. The remaining electrodes are electrically connected to the other opposing pad. All electrodes span substantially all the transverse distance between the opposing pads unlike the weighting of previous oversampled SAW structures. Also unlike the previous over sampled structures, the spacing of the samples is not necessarily uniform. Also unlike the previous over sampled structures, the sequence of connection of electrodes in any one wavelength segment of the preselected frequency varies in a longitudinal direction to effect an enhanced withdrawal weighting. In previous withdrawal weighting, the desired function is approximated in any one wavelength segment by choosing a relative strength of zero or one, whereas in the present invention a desired function is approximated with greater accuracy in that the withdrawal weighting choices for effective strength for any one wavelength segment is between three or more levels (zero, one and at least one added intervening level). Further in accordance with the present invention, the effective amplitude choices may be further increased by considering the combined effects of several electrodes interacting between nearby one wavelength segments.

These and other objects, advantages and features of this invention will be apparent from the following description taken with reference to the accompanying drawing, wherein is shown the preferred embodiment of the invention.

In the present invention, the over sampling is used to implement various tap amplitudes for full beamwidth (non-apodized) taps which are then used to improve the withdrawal weighting technique. The various tap amplitudes are achieved because (a) the individual taps in the oversampled structure have less effective amplitude than the sum of multiple taps working together and (b) the effective strength of several taps working in concert can be reduced from that of a single tap due to cancellation of radiated waves due to spacing of the taps in question.

BEST MODE FOR CARRYING OUT THE INVENTION

Figure 1:
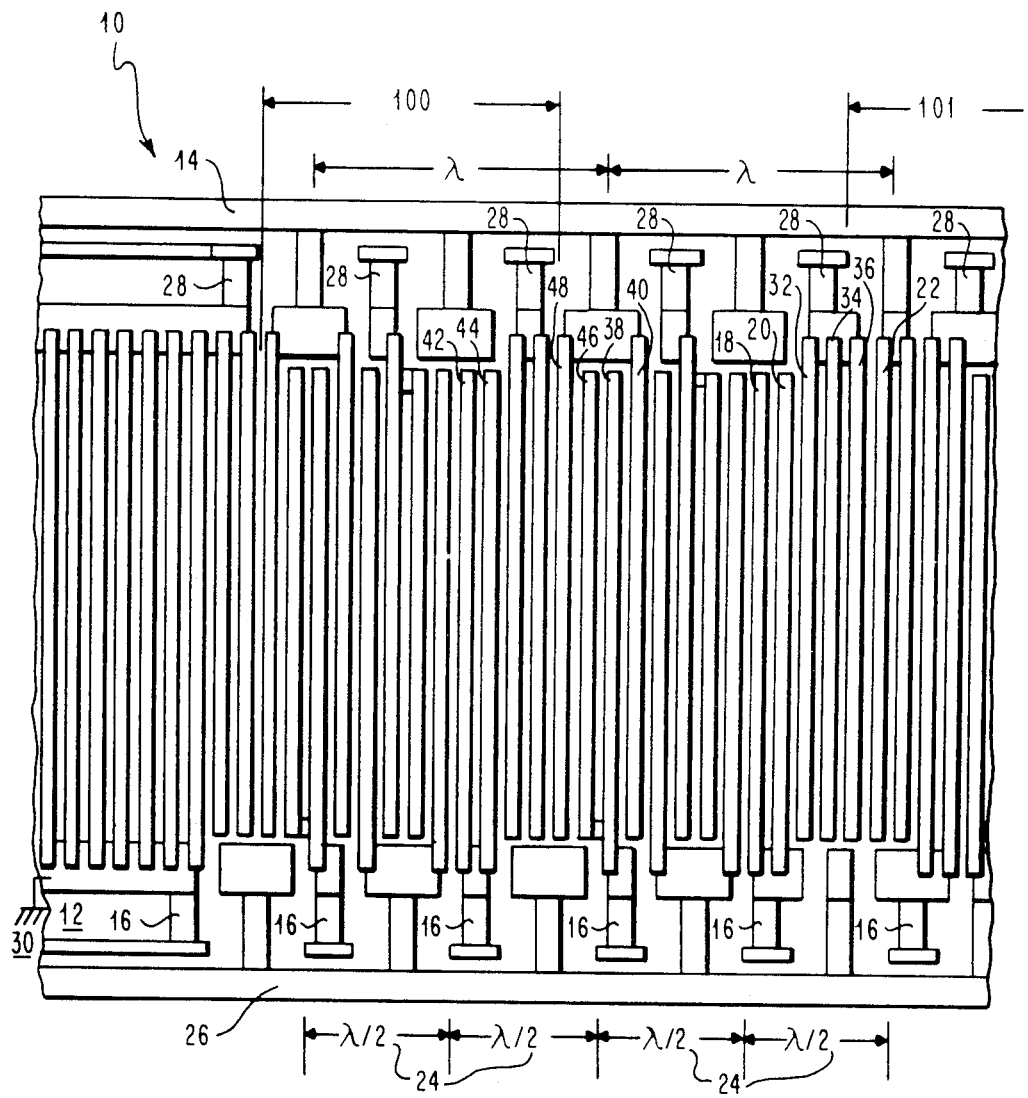
FIG. 1 is a surface wave device according to the present invention.

Referring now to the drawing, and in particular to FIG. 1, a surface wave device according to the present invention is referred to generally by reference numeral 10. Surface wave device 10 includes substrate means having at least a surface layer 12 of piezoelectric material, at least one pair of opposing electrically conducting pads 14 and 16 disposed on piezoelectric surface 12, and a first group of at least two electrodes 18 and 20 in a distance of one half wavelength 24 where the distance longitudinal with respect to opposing pads 14 and 16 has been divided up into one half wavelength distances. Similarly, surface wave device 10 includes opposing pads 26 and 28 disposed on piezoelectric surface 12. Pad 16 is illustrated only in part but is a continuous pad which is longitudinal in the same direction as pad 14, bridging over the intervening portions of pad 26 so as to not make electrical contact with that pad. Surface wave device 10 is mounted in a case 30, and in the particular embodiment illustrated, pads 16 and 28 are grounded to case 30.

Electrodes 18, 20 and 22 are disposed transversely to opposing pads 14 and 16 between the opposing pads. At least one of the electrodes, in this case electrodes 18 and 20, is electrically connected to one of the opposing pads 16 and the remaining electrodes, in this case electrode 22, are electrically connected to the other opposing pad 14. The sequence of the electrodes is not the most evenly distributed with respect to which of the pads the electrodes are connected to.

In this way, the aforementioned wavelength sections are able to couple with varying strength to the frequency of interest. In wavelength long section labeled 100, the phase 1 electrodes coupled to the frequency of interest with a strength of 2×cos(45°) whereas, in section 101, the coupling strength is 2×cos(15°). Thus illustrating how the strength of coupling to the frequency of interest can take on values other than just 0 or 1 by the use of over sampling.

Figure 2:
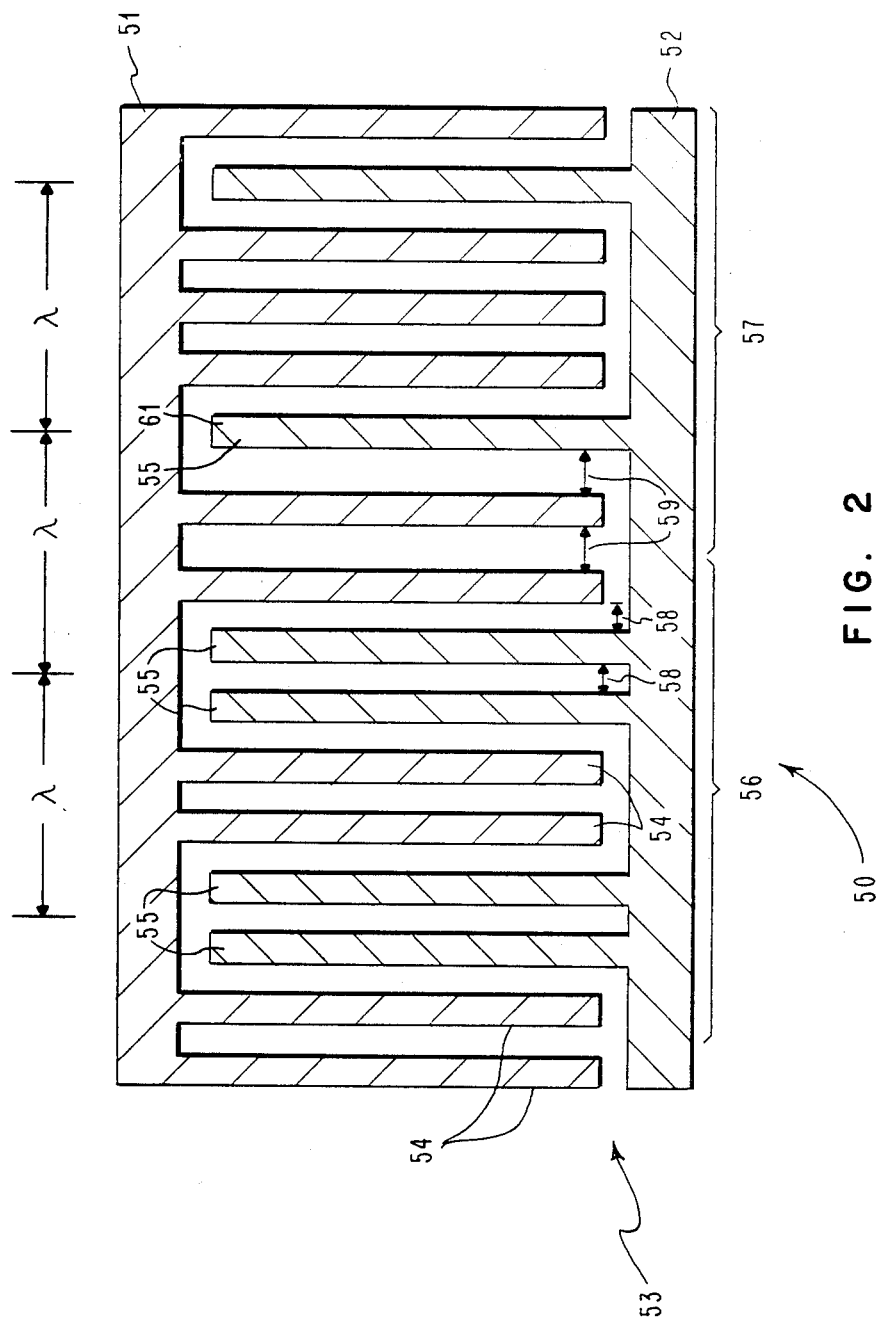
FIG. 2 is another embodiment of a surface wave device according to the present invention.

Referring now to FIG. 2, a depiction of preferred embodiment of the invention referred to generally by reference numeral 50, illustrating a bi-directional transducer with an average of four electrodes per wavelength. Surface wave device 50 includes a substrate having at least a surface layer 53 of piezoelectric material, at least two opposing electrically conducting pads 51 and 52 disposed on piezoelectric surface 53 and a plurality of electrodes referred to by reference numeral 54 and 55, electrically connected to the pads 51 and 52 respectively. Representative electrodes illustrated may comprise gold, aluminum or other suitable metals known to those skilled in the art, and are interleaved with the number of "hot" electrodes 55 varying from one wavelength long section to another. In the two wavelength long section labeled 56, there are two examples of the maximum coupling case wherein two adjacent "hot" electrodes are surrounded by two grounded electrodes 54. Each of these two sections has an effective tap weight of 1.0. In contradistinction, the section labeled 57 has a smaller effective tap weight due to only one "hot" electrode 55 in each wave length with an effective tap weight of (0.707) one divided by the square root of two. In order to insure the placement of this particular electrode labeled 61, at the peak of the cosinusoid into which we are attempting to couple, two resynchronization gaps, labeled 59, are used. Whereas the maximally coupling wavelength sections use two "hot" electrodes spaced 90 degrees apart (at center frequency), the smaller coupling sections use one electrode centered at 0 degrees. The use of the resynchronization gap allows these sections to be centered; in normal practice the resynchronization gaps are placed in a full wavelength section of grounded electrodes. Further gradation of coupling strength can also be realized for device 10 of FIG. 1 using the resynchronization gap concept. Doing so provides for odd numbers of "hot" electrodes in each phase section while maintaining nominally 12 electrodes per wavelength.

Referring now to FIG. 3, different strengths of coupling to the frequency of interest are available for various integral numbers of electrodes per wavelength. For example, two electrodes per wavelength can couple to the frequency of operation with either no strength or full strength—only two states. However, with four electrodes per wavelength, there are three possible coupling strengths (FIG. 3a) and with eight electrodes per wavelength, seven distinct states (FIG. 3b) are possible. Consequently, we see sampling at eight times the frequency of interest provides us over twice as many "gray scale" strengths.

This invention is not limited to integral numbers of electrodes per wavelength but the table of FIG. 3 does give an indication of the improvement resulting from its application. In addition, the possibility of using three or more phases in a unidirectional transducer arrangement has likewise not been illustrated, but the device 10 shows how such an extension of the present invention is made, and how such an extension of the present invention is made, and how the invention is not limited to bi-phase transducers.

Figure 3B:
FIG. 3 is a table illustrating various strengths of coupling to a frequency of interest for 2-4 (3a) and 6-8 (3b) electrodes per wavelength.
Figure 3B:
Figure 3B:
Figure 3B:
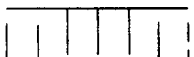
Figure 3B:
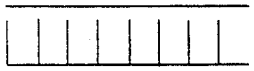
Figure 3B:
Figure 3B:
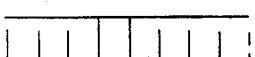
Figure 3B:
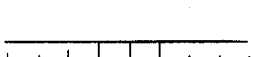
Figure 3B:
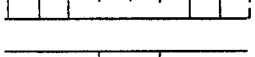
Figure 3B:
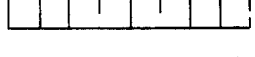
Figure 3B:
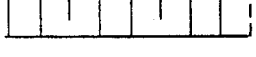
Figure 4A:
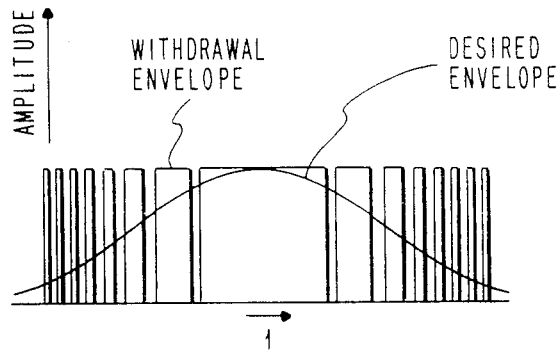
FIG. 4 is a comparison of the envelope of a conventional withdrawal weighted device 4a and the envelope of a withdrawal weighted device 4b according to the present invention.
Figure 4B:
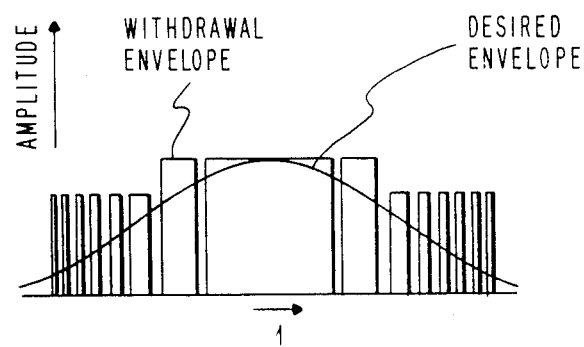

The overall effect of this invention is diagrammed in FIG. 4, which depicts the desired continuous time function and the withdrawal weighting approximation to it. The withdrawal weighting function depicted is the effective tap strength for a particular frequency of operation. Notice, in particular, that the conventionally withdrawal weighted response shown in FIG. 4a only takes on values of 0 and 1. By contrast, FIG. 4b depicts the effect of using all three coupling strengths detailed in FIG. 3 for the four electrodes per wavelength case. A better approximation to the desired waveform is obtained by the present invention as shown in FIG. 3b because of the finer control over the coupling strength available.

In all the embodiments shown in the drawings, the effective coupling variation is obtained through considering the opperative effects of various combinations of connective sequences of over sampled taps all within a space of less than one wavelength. However, even more combinations of effective coupling can be realized by use of connection sequences which span more than one wavelength. This is clearly a reasonable approximation in that the withdrawal approximation itself is based on averaging effects over several wavelengths.

The higher the sampling rate, the number of electrodes per wavelength, the more control over the "tap weight," in other words, the more closely the desired impulse can be approximated. There are restraints on how many electrodes can be placed per wavelength because of the production restraints associated with lithography or other production techniques. There is a preference for having multiples of four electrodes per wavelength in order to cancel reflections, although this becomes less important as the number of electrodes per wavelength gets higher.

From the foregoing, it will be seen that this invention is one well adapted to attain all of the ends and objects set forth, together with other advantages which are obvious and which are inherent to the apparatus.

It will be understood that certain features and subcombinations are of utility and may be employed without reference to other features and subcombinations. This is contemplated by and is within the scope of the claims.

As many possible embodiments may be made of the invention without departing from the scope thereof, it is to be understood that all matter herein set forth or shown in the figures of the accompanying drawing is to be interpreted as illustrative and not in a limiting sense.

I claim:

1. A surface wave device for operation at a preselected frequency, comprising in combination:
   substrate means having at least a surface layer of piezoelectric material;
   at least one pair of opposing electrically conducting pads disposed on the piezoelectric surface;
   at least one electrode disposed transversely to the opposing pads on the piezoelectric surface between the opposing pads and electrically connected to only one of the opposing pads; and
   at least two electrodes disposed transversely to the opposing pads on the piezoelectric surface between the opposing pads and electrically connected to only the other opposing pad wherein the at least three electrodes are completely within one half wavelength at the preselected operating frequency in a direction longitudinal to the opposing pads.

2. A surface wave device according to claim 1 wherein the at least one electrode is at least two electrodes.

3. A surface wave device according to claim 2 wherein one of the opposing pads is grounded.

4. A surface wave device according to claim 3 wherein the total of at least four electrodes forms one group, further comprising at least two additional groups of at least four electrodes each similar to the first group wherein the connection sequence of the electrodes within said group is distinct from the connection sequence of at least two of the other groups.

5. A surface wave device according to claim 1 wherein one of the opposing pads is grounded.

6. A surface wave device according to claim 5 wherein the total of at least three electrodes forms one group, further comprising at least two additional groups of at least three electrodes each similar to the first group wherein the connection sequence of the electrodes within each group is distinct from the connection sequence of at least two of the other groups.

7. A surface wave transducer disposed on a piezoelectric surface operable to convert between an electrical signal and acoustic surface waves propagating on the piezoelectric surface, comprising in combination:
   at least one pair of opposing electrically conducting pads disposed on the piezoelectric surface;
   at least one electrode disposed transversely to the opposing pads on the piezoelectric surface between the opposing pads and electrically connected to only one of the opposing pads; and
   at least two electrodes disposed transversely to the opposing pads on the piezoelectric surface between the opposing pads and electrically connected to only the other opposing pad wherein the at least three electrodes are completely within one half wavelength at the preselected operating frequency in a direction longitudinal to the opposing pads.

8. A surface wave device according to claim 7 wherein the at least one electrode is at least two electrodes.

9. A surface wave device according to claim 8 wherein one of the opposing pads is grounded.

10. A surface wave device according to claim 9 wherein the total of at least four electrodes forms one group, further comprising at least two additional groups of at least four electrodes each similar to the first group wherein the connection sequence of the electrodes within each group is distinct from the connection sequence of at least two of the other groups.

11. A surface wave device according to claim 7 wherein one of the opposing pads is grounded.

12. A surface wave device according to claim 11 wherein the total of at least three electrodes forms one group, further comprising at least two additional groups of at least three electrodes each similar to the first group wherein the connection sequence of the electrodes within each group is distinct from the connection sequence of at least two of the other groups.

13. A surface wave device for operation at a preselected frequency, comprising in combination:
   substrate means having at least a surface layer of piezoelectric material;
   a first electrically conducting pad for receiving an electrical signal;
   a second electrically conducting pad opposing the first electrically conducting pad wherein the second pad is grounded; and
   a plurality of electrodes disposed on the piezoelectric surface extending from the first pad toward the second pad wherein the number of such electrodes in distances of one half wavelength of the preselected frequency in a direction longitudinal to the opposing pads varies in the longitudinal direction and there are at least three such numbers which are distinct from each other.

14. A surface wave device according to claim 13 further comprising a plurality of electrodes disposed on the piezoelectric surface extending from the second pad toward the first pad wherein the combined number of electrodes extending from the two pads in distances of one half wavelength is a constant.

* * * * *